US005079587A

United States Patent [19]

Tanabe et al.

[11] Patent Number: 5,079,587

[45] Date of Patent: Jan. 7, 1992

[54] IMAGE RECORDING APPARATUS HAVING DEVICE FOR ADJUSTING POSITION OF MASK MEMBERS

[75] Inventors: Kazunori Tanabe; Tomoaki Hattori, both of Nagoya; Susumu Kuzuya, Gihu; Takakuni Sonoda, Toyoake; Toshio Sakai; Makoto Suzuki, both of Nagoya; Hidenori Hisada, Tokoname; Hiroshi Taira, Ichinomiya, all of Japan

[73] Assignee: Brother Kogyo Kabushiki Kaisha, Japan

[21] Appl. No.: 617,203

[22] Filed: Nov. 23, 1990

[30] Foreign Application Priority Data

Feb. 15, 1990 [JP] Japan .................................... 2-34946

[51] Int. Cl.[5] ........................ G03B 27/32; G03B 27/52

[52] U.S. Cl. ........................................ 355/32; 355/27; 355/35; 355/77

[58] Field of Search ........................ 355/27, 32, 35, 77

[56] References Cited

U.S. PATENT DOCUMENTS 4,748,475 5/1988 Ishiyama et al. ...................... 355/27

*Primary Examiner*—Richard A. Wintercorn

*Attorney, Agent, or Firm*—Oliff & Berridge

[57] ABSTRACT

An image recording apparatus using a set of mask members and having mask position adjusting device. A transparent mask member supporting plate is provided at the exposure position. Each of the mask member is delivered upon the mask member supporting plate by two pairs of rollers. In this mask delivery, a mask image surface faces upwardly. An elongated photosensitive recording medium is positioned immediately above the mask member supporting plate so as to guide the medium at the exposure position. Further, an exposure device including a light source and color filters is positioned below the mask member supporting plate. The mask member undergoes positional adjustment at the exposure position. For this, the mask member supporting plate is supported on a positioning frame which is movable in a direction perpendicular to the mask member moving direction. The position of the mask member with respect to the running direction thereof is controllable by controlling rotations of two pairs of rollers, and the mask position with respect to its tranverse direction is controllable by controlling the movement of the positioning frame.

16 Claims, 4 Drawing Sheets

IMAGE RECORDING APPARATUS HAVING DEVICE FOR ADJUSTING POSITION OF MASK MEMBERS

BACKGROUND OF THE INVENTION

The present invention relates to an image recording apparatus for recording a color image on a photosensitive recording medium using mask members.

Conventionally, red, green and blue mask members are produced based on an imaging information so as to selectively allow particular light to pass therethrough. Each of the mask members is of a light shieldable monochromatic image indicative of particular color of the imaging information. Three mask members are successively placed on an identical area of the photosensitive recording medium for performing exposures at three times for obtaining a latent image thereon. In this connection a related art is described in U. S. Pat. Nos. 4,884,082 and 4,949,185.

According to these U.S. Patents, the mask members are successively fed to an exposure position in such a manner that the mask member is electrostatically suspended from a transparent endless belt such as PET belt, and the suspended mask member is superposed with the photosensitive recording medium for exposure.

More particularly, as shown in FIG. 1, the red, green and blue mask members are successively fed one by one through an inlet 126 into an exposure position with a mask imaging surface facing downwardly. For example, when the red mask member is inserted through the inlet 126, the red mask member is directed downwardly and reaches one end (left end in FIG. 1) of an endless belt 102 extending in a horizontal direction. The endless belt 102 is formed of a transparent material and is charged with electricity by a charger (not shown). Therefore, the red mask member is attracted to the endless belt 102 and is fed to an exact exposure position because of the running movement of the endless belt 102. When the mask member reaches the predetermined exposure position, movement of the endless belt 102 is stopped.

At a position immediately below the endless belt 102, a photosensitive recording medium 106 drawn out of a cartridge 104 is positioned in parallel with the endless belt 102. Therefore, exposure operation is performed when the mask member confronts an exposure area of the photosensitive recording medium 106. A lamp 108 for the light exposure is positioned above the endless belt 102, and a filter unit including red, green blue filters 110R, 110G and 110B is positioned between the lamp 108 and the endless belt 102. The filter unit is movable in a horizontal direction so that one of the filters can be selectively positioned immediately below the lamp 108.

First, the red filter 110R is brought to the position immediately below the lamp 108, and the lamp 108 and the filter unit are integrally moved from one end to another end of the endless belt 102 for a light scan. Therefore, red light is irradiated onto the photosensitive recording medium 106 through the red filter 110R, the transparent endless belt 102 and the red mask member. In this case, the light can transmit the transparent base sheet of the mask member. However, the light is shielded or blocked at the monochromatic mask image formed on the mask member. Accordingly, the photosensitive recording medium is formed with a latent image indicative of the red color.

Upon completion of this operation, the endless belt 102 is further moved so as to discharge the red mask member therefrom(rightwardly in FIG. 1). The red mask member separated from the endless belt 102 is moved upwardly along a mask feed path. The mask feed path is branched into upper buffer section 116*a* and a lower buffer section 116 at a junction 114 at which a gate 118 is provided for selectively delivering the mask member toward upper and lower buffer sections. The red mask member is provisionally stored in the upper buffer section 116.

While maintaining the photosensitive recording medium 106 at the exposure position, the green mask member is then fed through the inlet 126 toward the exposure position when the precedent red mask member is discharged therefrom. The green mask member reaches the exact exposure position in a manner similar to the red mask member. When the green mask member confronts the exposure zone of the photosensitive recording medium 106, the lamp 108 and the filter unit are again moved from one end to the other end of the endless belt 102 with the green filter 110G being positioned immediately below the lamp 108. Thus green light exposure is achieved with respect to the exposure zone of the medium 106. Upon completion of the green light exposure, the green mask member is discharged out of the exposure position by the movement of the endless belt 102 and is delivered into the lower buffer section 116*b*. Simultaneously, the blue mask member is transferred to the exposure position and blue light exposure is performed with the blue light scanning in using the blue filter 110B.

Because of the three times exposure at the identical area of the photosensitive recording medium 106, red, green and blue latent images are superposedly formed on the identical area. The photosensitive recording medium 106 is then fed to a developing unit and a subsequent zone of the medium is pulled out of the cartridge 104 and is brought to the exposure position in confrontation with the endless belt 102.

On the other hand, the blue mask member is discharged out of the exposure position, and enters the upper buffer section 116*a*. Further, the red mask member previously stored in the upper buffer 116*a* is fed out of the buffer 116*a*, and is again delivered to an upstream portion of the exposure position. The red mask member is again introduced into the exposure position by the movement of the endless belt 102 so as to start a next exposure operation.

Therefore, the mask members are circulated in a closed loop for obtaining desired numbers of the color output images. In this case, the pivotal position of the gate 118 is controlled in accordance with the storage states in the upper and lower buffer segments 116*a* and 116*b*. When the desired numbers of the exposures are completed, these mask members are discharged through an outlet 120.

In the image recording apparatus shown in FIG. 1, the mask image surface of the mask member must be superposed with the photosensitive recording medium 106. Further, when the mask image is provided at a laser printer, the mask image surface faces upwardly. If the laser printer is mounted on the image recording apparatus, the mask member is introduced to the exact exposure position with the mask image surface facing downwardly. In this connection, the mask member must be positioned above the photosensitive recording medium 106 and must be hangingly suspended. For the mask suspension, the endless belt 102 is required, and it must be electrostatically charged in order to attract the non imaging surface of the mask member thereto.

Accordingly, additional components are required such as a charger, and means for preventing the suspended mask member from being dropped from the endless belt such as a roller and holding pawls. Consequently, resultant device becomes complicated and costly. Furthermore, in spite of the disposition of the means for mask member drop preventing means, it would be almost impossible to perfectly prevent the mask member from falling down from the endless belt 102. Therefore, high reliability may not be attainable. To be more specific, the circumambient condition may affect the electrostatic attraction of the mask member to the endless belt 102. For example, if high ambient humidity is provided, the attraction force may be lowered.

Moreover, the production of the transparent endless belt may be costly, and coating may be required to the endless belt to impart resistivity against any injury. Such coating may also increase production cost.

SUMMARY OF THE INVENTION

It is therefore, an object of the present invention to overcome the above described drawbacks and disadvantages, and to provide an improved image recording apparatus capable of providing high reliability in terms of positioning the mask member at an exposure position without any mask member falling down.

Another object of the invention is to provide such image recording apparatus having stabilized holdability with respect to the mask member at the exact exposure position.

Still another object of the invention is to provide such improved image recording apparatus provided at low cost with simple construction.

These and other objects of the invention will be attained by providing an image recording apparatus for recording a color image with using mask members, each of the mask members being formed with a light shieldable mask image based on an imaging information and each of the mask members being successively fed toward a photosensitive recording medium at an exposure position for superposedly forming latent images thereon upon exposures, the apparatus comprising mask member supporting means upon which each one of the mask members is placed, the mask member supporting means being positioned at the exposure position, the mask member supporting means being also positioned above the photosensitive recording medium fed at the exposure position, mask member feeding means for moving each of the mask members onto the mask member supporting means, the mask feeding means feeding the mask member with the mask image facing upwardly, and a light source positioned below the mask member supporting means.

In another aspect of the invention, there is provided an image recording apparatus for recording a color image on a developer medium with using mask members produced by trichromatic color resolution, each of the mask members being formed with a light shieldable mask image based on an imaging information and with at least one positioning mark, and each of the mask members being successively fed in a first direction and placed on a photosensitive recording medium at an exposure position for forming a latent image thereon upon exposure, the apparatus comprising a main frame, a positioning frame movable relative to the main frame, sensor means for detecting the positioning mark, the sensor means generating an output signal, a first pair of rollers rotatably supported by the positioning frame and at a position adjacent one side of the exposure position for feeding the mask member in the first direction, a second pair of rollers rotatably supported by the positioning frame and at a position adjacent another side of the exposure position for feeding the mask member in the first direction, a distance between the first and second pair of rollers being smaller than a length of the mask member in the direction, a transparent member supported by the positioning frame and positioned at the exposure position and between the first and second pairs of rollers, each one of the mask members being fed onto the transparent member for exposure operation, laterally moving means for moving the positioning frame in a second direction perpendicular to the first direction, and control means connected to the first and second pairs of rollers and to the laterally moving means for controlling these rollers and the moving means in response to the output signal from the sensor means. BRIEF DESCRIPTION OF THE DRAWINGS FIG. 1 is a cross-sectional view showing a mask member suspension device and an exposure device according to a conventional image recording apparatus;

FIG. 2 is a schematic elevational view showing a laser printer and an image recording apparatus according to the present invention;

FIG. 3 side elevational view showing a mask position adjusting device according to one embodiment of this invention;

DETAILED DESCRIPTION OF THE PREFERRED EMBODIMENTS

Figure 1:
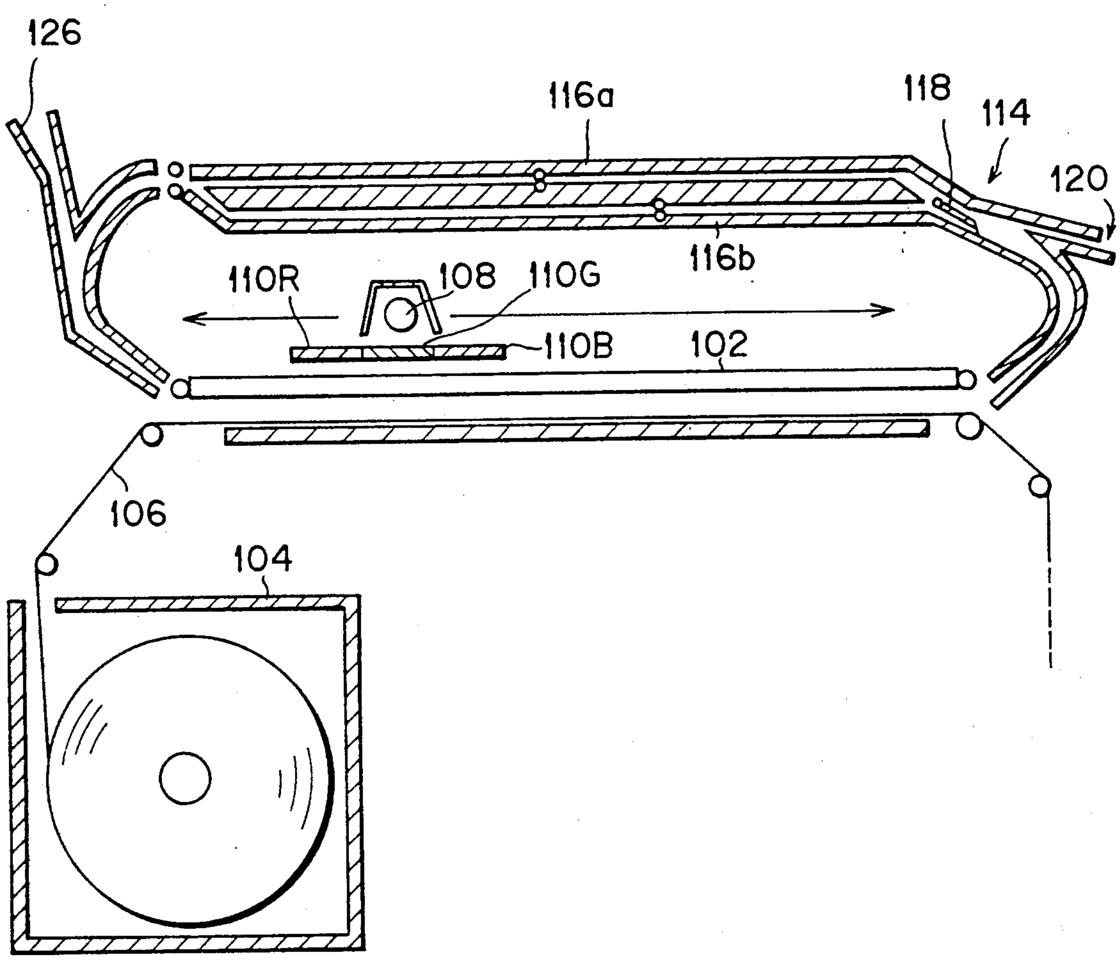
Figure 2:
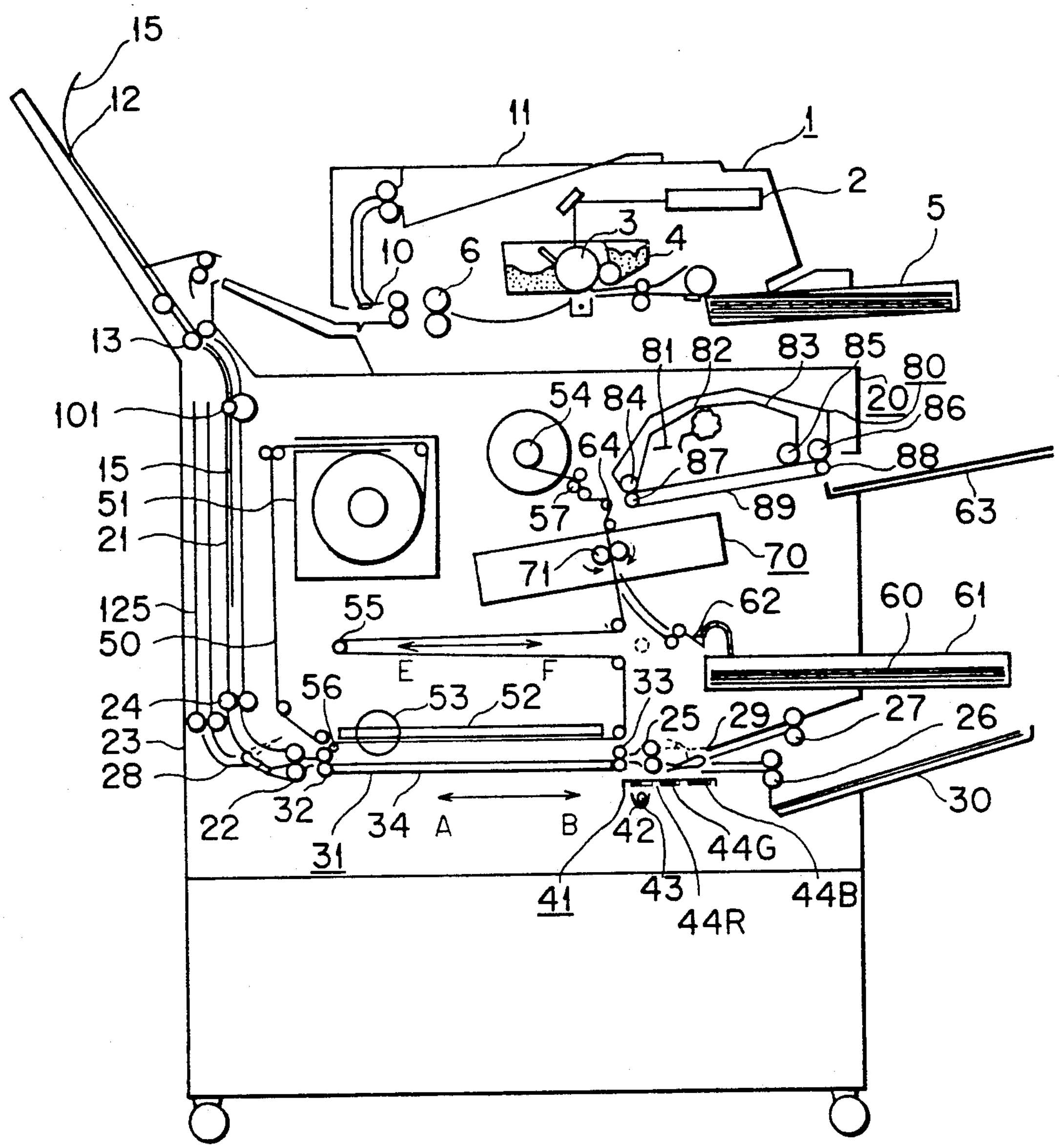

FIG. 2 shows a color image recording apparatus 20 coupled to a monochromatic laser beam printer 1 placed on the top of the apparatus 20. The laser printer 1 is generally adapted for recording data transmitted from a host computer. The laser beam printer 1 has a polygon scanner 2 which applies a laser beam to an electrically charged cylindrical photosensitive member 3 to form an electrostatic latent image on its outer circumferential surface. A developing unit 4 is disposed alongside of the photosensitive member 3 for developing the electrostatics latent image on the photosensitive member 3 into a visible toner image. An image transfer unit is positioned below the photosensitive member 3 for transferring the toner image from the photosensitive member 3 onto a sheet of plain paper or an OHP sheet.

A sheet cassette 5 storing a stack of the sheets of plain paper or OHP sheets is detachably inserted in the casing of the laser beam printer. The sheets in the sheet cassette 5 are fed one by one between the photosensitive member 3 and the image transfer unit by a sheet feed roller positioned near the sheet cassette. An image fixing unit 6 having a pair of fixing rollers is disposed downstream of the photosensitive member 3, and a sheet path selector 10 is disposed downstream of the image fixing unit 6. A sheet discharge tray 11 is disposed on the upper panel of the laser beam printer 1, whereas another sheet discharge tray (automatic sheet feeder ) 12 is positioned outside of the laser beam printer 1 downstream of its output slot near the sheet path selector 10. If a monochromatic or a black-and-white image is to be reproduced, then the printed sheet from the image fixing unit 6 is selectively discharged by the sheet path selector 10 onto the sheet discharge tray 11 or onto the automatic sheet feeder 12. If a colored image is to be reproduced, then the printed sheet from the image fixing unit 6 is first discharged onto the automatic sheet feeder 12, and then fed into the color image recording apparatus 20.

A set of three monochromatically printed sheets from the laser beam printer 1 is used as a set of mask members 15R, 15G, 15B (also referred to collectively as a mask member or members 15) in the color image recording apparatus 20. For this, a feed roller 13 is provided at an inlet portion of the image recording apparatus 20 so as to fed the each one of the mask members 15 one by one on the tray 12 into the apparatus 20. On each of the mask members 15, positioning marks 120 (see FIG. 4) are printed at a trail end portion thereof. This printing is made concurrent with the formation of the mask image.

The construction of the color image recording apparatus 20 will be described below.

A mask position adjusting device 31 is positioned at a lower internal space. Further, a mask transferring path 21 is defined between the automatic sheet feeder tray 12 and the mask position adjusting device 31. At one side of the mask position adjusting device 31, there are provided pairs of rollers 22, 23 and 24, a gate 28 and a mask storage portion 102, and at another side of the device 31, there are provided pairs of rollers 25, 26 and 27 and a gate 29. These gates 28 and 29 are pivotally movable as shown by solid lines and broken lines in FIG. 2. These roller pairs 22, 23, 24, 25 and 26 are subjected to sequential control for the copying operation by a microcomputer of a control means (FIG. 5) in order to be rotatable in a normal or reverse direction. Thus, the mask members are fed in normal or reverse direction. The feeding mode of the mask members will be described later in detail.

Further, at the mask transferring path 21, a pair of re-curl rollers 101 are provided so as to remove a curl given to the mask members 15 discharged out of the laser printer 1. Furthermore, a mask member discharge tray 30 is provided at a position downstream of the roller pairs 25 and 27 so as to receive a used mask member.

Figure 6:
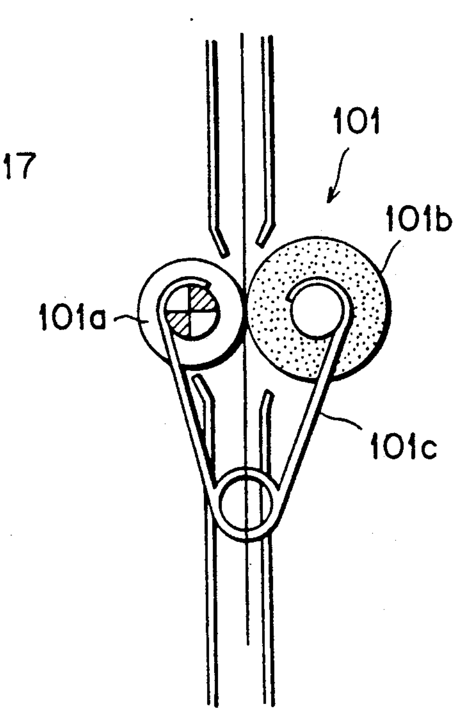
FIG. 6 is a cross-sectional view showing curl removing means for removing a curl imparted to the mask member discharged out of the laser printer according to the present invention.

Details of the pair of curl removing rollers 101 will be described with reference to FIG. 6. The pair of curl removing rollers 101 is adapted to remove the curl imparted to the mask member when it is fed onto the automatic sheet feeder tray 12. When the mask member 15 fed from the laser printer 1 is positioned onto the tray 12, the leading edge of the mask member when it has been passed through the printer 1 becomes a trailing edge with respect to the mask transferring path 21. Further, the trailing edge is curled upwardly as shown in FIG. 2, that is, the trailing edge is bent toward an imaging surface of the mask member 15. The pair of curl removing rollers 101 includes, as shown in FIG. 6, a first roller 101*a*, a second roller 101*b* and a torsion spring 101*c*. Hardness of the first roller 101*a* is higher than that of the second roller 101*b*, and a diameter of the first roller 101*a* is smaller than that of the second roller 101*b*. The second roller 101*b* is formed of soft material such as foamed urethane and polyurethane rubber. The torsion spring 101*c* is adapted to provide surface contact between the first and the second rollers 101*a* and 101*b*. Because of the biasing force of the spring 101*b*, the second roller 101*b* is urged toward the first roller and is deformed along the outer peripheral surface of the first roller 101*a*. The first roller 101*a* is drivingly rotated by a conventional drive motor (not shown). The curled mask member 15 is linearly oriented because the mask member is properly nipped under pressure between the first and the second rollers 101*a* and 101*b*.

Figure 3:
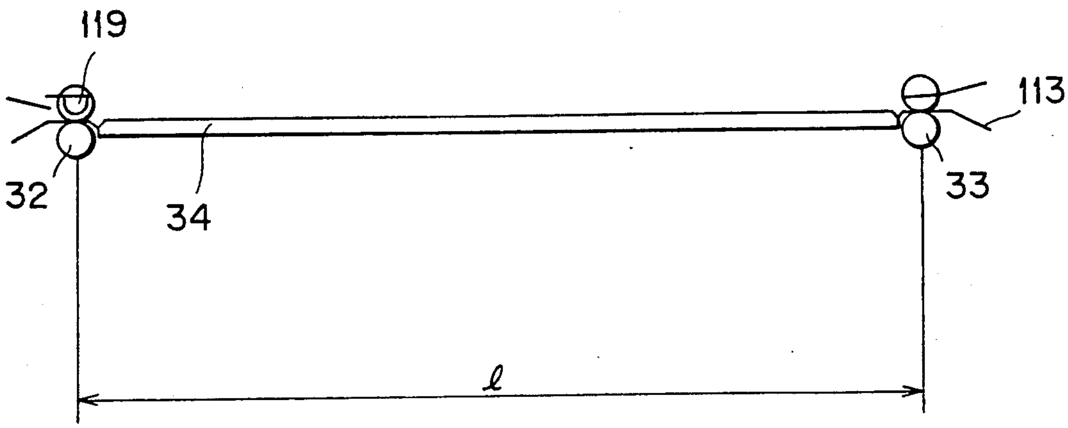

Next, details of the mask position adjusting device 31 will be described with reference to FIGS. 3 and 4.

Figure 4:
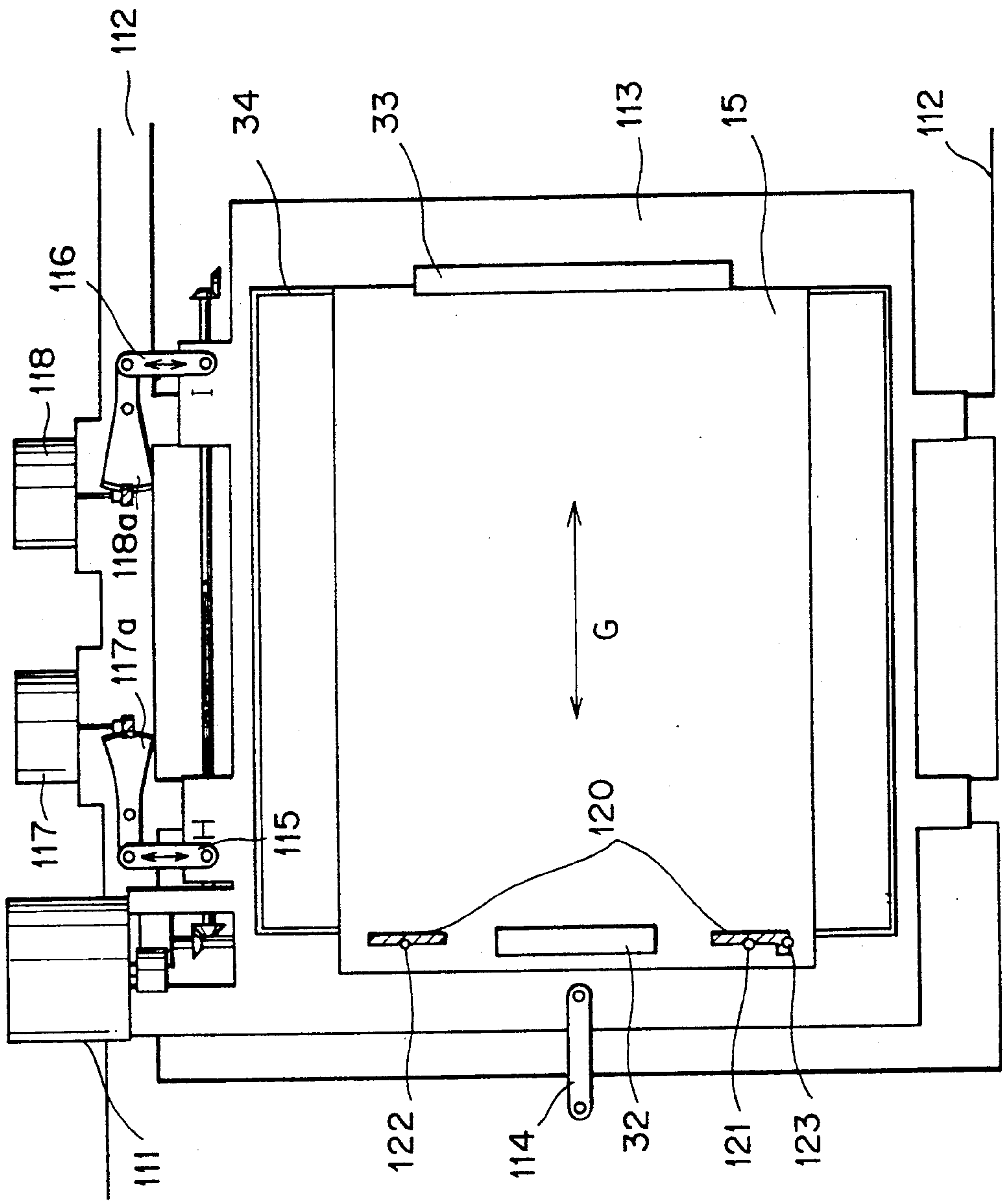
FIG. 4 is a plan view showing the mask position adjusting device according to the one embodiment of this invention.

A first pair of rollers 32 and a second pair of rollers 33 are provided for feeding the mask member 15 in a direction indicated by an arrow G in FIG. 4. A distance between the first and second pairs of rollers 32 and 33 is set L which is smaller than a longitudinal length of the mask member 15. These rollers 32 and 33 are driven by a motor 111 as a drive source through a plurality of gears and a shaft. These rollers 32 and 33 are rotatably supported to a positioning frame 113.

The positioning frame 113 is movably supported in a horizontal direction to a main frame 112. A first link 114 is provided between the main frame 112 and the positioning frame 113, and laterally movable links 115 and 116 are also provided between the main frame 112 and the positioning frame 113. These links are adapted to restrict a position of the positioning frame 113 with respect to the main frame 112. The laterally movable links 115 and 116 are drivingly connected to drive motors 117 and 118 through gears 117*a*, 118*a*, respectively, so that the links 115 and 116 are linearly movable in the lateral direction indicated by arrows H and I in FIG. 4, to thereby move the positioning frame 113 in the lateral direction.

The positioning frame 113 is formed with a central rectangular window at which a glass plate 34 is fitted. Therefore, the mask member 15 positioned between the roller pairs 32 and 33 is guided on and along the glass plate 34 through which upwardly directed exposure light can be transmitted. Further, at a position adjacent the first pair of rollers 32, a sensor attachment segment 119 (FIG. 3) is positioned which is provided to the main frame 112, and a reflection type optical sensor S (FIG. 5) is attached to the sensor attachment segment 119 so as to detect the positioning marks 120 at their detecting positions 121, 122 and 123.

The lower pair of rollers 26 also provides a linear mask feed/discharge path extending in parallel with the glass plate 34. Further, the upper pair of rollers 27 also provide a substantially linear second mask feed/discharge path. Therefore, in these feed/discharge paths, mask member jamming can be substantially obviated.

With the structure, the mask member 15 is fed on the glass plate 34. In this case, the position of the mask member 15 in its running direction is controllable by rotating the rollers 32 and 33 in normal or reverse direction. Further, the position of the mask member 15 in its transverse direction is controllable by moving the positioning frame 113 in a direction perpendicular to the running direction. The latter movement is provided with moving the laterally moving links 115 and 116 by driving the motors 117 and 118. Furthermore, orientation of the mask member 15 can be controlled by independently moving the links 115 and 116 of each other.

Figure 5:
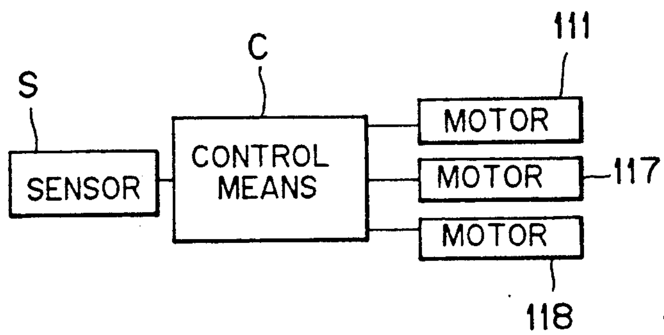
FIG. 5 is a block diagram for description of a control to the mask position adjusting device according to the one embodiment of this invention.

For such control, control means C is provided as shown in FIG. 5. The control means C is connected to the sensor S. The sensor S is adapted to generate detection signals when detecting the positioning mark 120 at the detecting positions 121, 122 and 123, and the detection signals are transmitted to the control means C. Further, the control means C is connected to the above described motors 111 for driving the rollers 32, 33, to the second motor 117 for moving the laterally moving link 115 and to the third motor 118 for moving the laterally moving link 116. The laterally movable links 115, 116, the gears 117*a*, 118*a*, and the second and the third motors 117, 118 serve as laterally moving means for moving the positioning frame 113 in a direction perpendicular to the running or longitudinal direction of the mask member.

As shown in FIG. 2, an exposure device 41 is disposed at a position below the positioning device 31. The exposure device 41 is reciprocally movable horizontally along the positioning unit 31. The exposure device 41 includes a linear light source or lamp 42 for emitting white light, a reflecting member 43 for reflecting light from the light source 42, and a color separation filter unit 44 having three color separation filters 44R, 44G, 44B of red, green and blue. When the light source 42 is positioned below the position adjusting device 31, the light from the light source is projected onto the mask member 15 through the glass plate 34.

A photosensitive recording medium or sheet 50 is primarily made of photocurable resins including a photopolymerization initiator known from Japanese Patent Application Kokai No. 62(1987)-143044, for example. More specifically, the photosensitive recording medium 50 includes a base sheet coated with photocurable resins which will be photocured upon exposure to lights having wavelengths of red, green, and blue, and microcapsules containing dye precursors of cyan, magenta, and yellow. The photosensitive recording medium 50 is housed in the form of a roll in a cartridge 51 in a light-shielded condition. The cartridge 51 is disposed upstream of the positioning unit 31. The photosensitive recording medium 50 is held under back tension by a shaft in its sheet roll on the cartridge 51.

An exposure table 52 is positioned above the mask position adjusting device 31. Further, a buffer roller 55 is movably positioned above the exposure table 52 for absorbing a sheet slack, and a pressure developing unit 70 having a pair of pressure rollers 71 is positioned above the buffer roller 55 for pressure developing operation. Furthermore, a separation roller 64 for separating the photosensitive recording medium 50 from a color developer sheet 60 (described later), a drive roller 57 and a takeup roller 54 are provided for winding the used photosensitive recording medium 50 thereover. The photosensitive recording medium 50 drawn out of the cartridge 51 passes through a space defined between the glass plate 34 and the exposure stand 52, and goes past the buffer roller 55, the pressure developing unit 70, the separation roller 64 and the drive roller 57, and is wound around the takeup roller 54.

The exposure table 52 is movable downwardly by a cam 53 for exposure operation by the exposure device 41, so that the mask member 15 transferred onto the glass plate 34 by the first pair of rollers 32 and photosensitive recording medium 50 are brought into intimate contact with each other. Further, a stationary roller 56 :s positioned at a position adjacent to one side of the exposure stand 52 and therebelow. Therefore, when the exposure stand 52 is moved to a predetermined downward position, the exposure stand 52 is brought into intimate contact with the stationary roller 56. to thereby fix the photosensitive recording medium 50 at a given position in intimate contact with one of the mask members 15R, 15G and 15B. Accordingly, during the exposure operation to the photosensitive recording medium 50 through one of the mask members, the medium 50 is fixedly interposed between the exposure and 52 and the stationary roller 56.

The color developer sheets 60 includes a base sheet coated with a color developer disclosed in Japanese Patent Application Kokai No. 58(1983)-88739, for example. A stack of such color developer sheets 60 is stored in a cassette 61 with their coated surfaces facing downwardly. The color developer sheets 60 are fed, one by one, from the cassette 61 by a suction disc 62 which is intermittently operated by an actuator (not shown), and supplied to the pressure developing unit 70. The supplied color developer sheet 60 is placed over the exposed area of the photosensitive recording medium 50, and pressed thereagainst by the pressure rollers 71 in the pressure developing unit 70, whereupon a latent image which has been formed on the photosensitive recording medium 50 by exposure to light from the exposure device 41 is visualized on the color developer sheet 60.

A thermal fixing unit 80 is also shown in FIG. 2. The unit 80 includes an upper segments having a casing 83, a heater 81 and a blade wheel 82 those housed in the casing 83, and a lower segments having a rubber rollers 84, 85, 86, another rollers 87 and 88 and an endless belt 89 mounted on the rollers 87, 88 for feeding the developer sheet 60 thereon. Further, a sheet discharge tray 63 is provided to receive thereon a finally treated developer sheet 60. The developer sheet 60 fed past the pressure developing unit 70 and the separation roller 64 is separated from the photosensitive recording medium 50 at the latter roller 64, and is then delivered into the thermal fixing unit 80 in order to impart a glossy image on the developer sheet, and is then discharged onto the discharge tray 63.

The color image recording apparatus 20 thus constructed operates as follows:

First, a description is made with respect to the formations of a plurality of color output images by using a set of mask members 15R, 15G and 15B.

It is assumed that a red mask member 15R is produced by the monochromatic laser beam printer 1. More specifically, an electrostatic latent image is formed on the surface of the photosensitive member 3 by the polygon scanner 2 based on a red color data to be recorded or printed, and then toner particles are applied to the latent image by the developing unit 4, thus visualizing the latent image into a toner image as a light-shielding image. A sheet is fed from the cassette 5 toward the photosensitive member 3, and the light-shielding toner image on the photosensitive member 3 is transferred onto the sheet from the cassette 5 by the image transfer unit. Then, the sheet is fed to the image fixing unit 6 in which the toner image is fixed to the sheet with heat by fixing rollers. The sheet is thereafter discharged as the red mask member 15R onto the automatic sheet feeder tray 12 by the sheet path selector 10. The red mask member 15R thus produced carries the light-shielding toner image except which light can pass through the red mask member 15R to photocure those microcapsules which contain a dye precursor of cyan on the photosensitive recording medium 50.

When the red mask member 15R is positioned on the automatic sheet feeder tray 12, the leading edge of the mask member 15R when it has been passed through the laser printer 1 is becoming a trailing edge with respect to the mask transferring path 21. Further, when the mask member 15R is delivered onto the tray 12, the tail edge is curled upwardly as shown in FIG. 2( bent toward the imaging surface of the mask member).

The red mask member 15R delivered to the automatic sheet feeder tray 12 is fed into the image recording apparatus 20 by the feed roller 13. In this case, the red mask member 15R is arcuately bent or curled toward its imaging side. Such red mask member 15R is delivered to the curl removing or correction rollers 101 through the mask transferring path 21, so that the curling is corrected. Then, the red mask member 15R is fed to the mask position adjusting device 31 by means of the roller pairs 24 and 22. In this case, the gate 28 has a solid line position in FIG. 2, so as to allow the red mask member 15R to pass therethrough and to reach the mask position adjusting device 31.

At the mask position adjusting device 31, the position adjusting mark 120 printed on the red mask member 15R is read by the sensor (not shown) attached to the sensor attachment segment 119, i.e., three points 121, 122, 123 are read by the sensor. In accordance with the output level from the sensor, the motors 111, 117 and 118 are energized, so that the red mask member 15R can undergo precise positional registration with respect to the main frame 112.

Prior to the positional adjustment to the red mask member 15R, the exposure stand 52 is moved to the predetermined downward position by the cam 53. Therefore, one end (left end in FIG. 2) of the exposure stand 52 is brought into contact with the stationary roller 56, to thereby fix the photosensitive recording medium 50 to the exposure stand 52. After completion of the mask position adjustment, the exposure stand 52 is further moved downwardly by the cam 53, so that the exposure stand 52 is brought into intimate contact with the glass plate 34. Accordingly, the red mask member 15R becomes intimate contact with the photosensitive recording medium 50.

When the exposure stand 52 is in close contact with the mask position adjusting device 31, the lamp 42 is turned on, and red light is applied from the red filter 44R through the mask member 15R to the photosensitive recording medium 50 while at the same time it is being scanned by the exposure device 41 in the direction indicated by the arrow A. The light from the lamp 42 passes through the red filter 44R and is applied through the mask member 15R to the photosensitive recording medium 50 to expose the same, thus forming a latent image corresponding to the red mask member 15R on the photosensitive recording medium 50. After the exposure, the lamp 42 is de-energized, and the exposure device 41 moves back in the direction indicated by the arrow B. When the exposure device 41 moves back, the color separation filter assembly 44 is moved by an actuator (not shown) to position the next green filter 44G above the lamp 42. While the exposure device 41 is moving back, the exposure table 52 is elevated by the rotation of the cam 53 so that the photosensitive recording medium 50 is spaced away from the positioning unit 31 and the red mask member 15R.

At this time, the photosensitive recording medium 50 is held under back tension by the shaft in its roll in the cartridge 51. When the exposure table 52 is moved downwardly, the length of the photosensitive recording medium 50 which corresponds to the downward displacement of the exposure table 52 is drawn out of the cartridge 51 against the back tension. When the exposure table 52 is moved upwardly after exposure, the length of the photosensitive recording medium 50 which corresponds to the upward displacement of the exposure table 52 is withdrawn into the cartridge 51 because of the back tension, thereby taking up any sag in the photosensitive recording medium 50.

After the exposure using the red mask member 15R is completed, the exposure stand 52 is moved to a predetermined upward position by the cam 53. In this instance, the one end (left end in FIG. 2) of the exposure stand 52 maintains intimate contact with the stationary roller 56, so that the photosensitive recording medium 50 is still held to the exposure stand 52.

Then, the green mask member 15G produced by the monochromatic laser beam printer 1 is fed through the automatic sheet feeder tray 12, the feed roller 13, the curl removing roller 101, and reaches the pair of rollers 24 through the sheet transferring path 21. Immediately before the green mask member 15G reaches the pair of rollers 24, the roller pairs 22, 24, 25 and 27 and roller pairs 32 and 33 of the mask position adjusting device 31 are rotated for feeding the red mask member 15R rightwardly in FIG. 2, whereby the red mask member 15R is discharged out of the mask position adjusting device 31. Simultaneously, the green mask member 15G is fed to the exposure position and is stopped. In this case, the gates 28 and 29 have solid line positions. Therefore, the red mask member 15R is fed to the upper branched sheet feed path. If the tail end of the red mask member 15R is fed past the gate 29, free switching operation to the gate 29 is attained, whereupon the rotation of the roller pair 27 is stopped. Accordingly, the red mask member 15R is suspended from the rollers 27 with a part of the red mask member 15R being interposed by the rollers 27.

The green mask member 15G fed onto the mask position adjusting device 31 is subjected to position adjustment relative to the photosensitive recording medium 50, similar to the position adjustment in case of the red mask member 15R. Then, the exposure stand 52 is moved downwardly, so that the photosensitive recording medium 50 and the green mask member 15G are brought into intimate contact with the glass plate 34 of the mask position adjusting device 31. Thereafter, the lamp 42 is turned on for exposing the photosensitive recording medium to green light through the green filter 44G. Upon completion of the exposure, the exposure stand 52 is moved to the predetermined upward position. The exposure device 41 restores its original position, and at the same time, the filter unit 44 is moved for positioning the blue filter 44B above the lamp 42.

Next, the blue mask member 15B produced at the laser printer 1 is fed into the image recording apparatus 20 in a manner the same as that in the case of the red and green mask members. When the blue mask member 15B is fed to a position immediate upstream of the pair of rollers 24, the roller pairs 24, 22, 25 and 26 and rollers 32 and 33 of the mask position adjusting device 31 are rotated for feeding the mask members rightwardly in FIG. 2. Therefore, the green mask member 15G is discharged out of the mask position adjusting device 31, and at the same time, the blue mask member 15B is brought to the exposure position. In this case the gate 28 has a solid line position in FIG. 2 whereas the gate 29 has a broken line position. Accordingly, the green mask member 15G can pass through the gate 29 and is interposedly held between the lower pair of rollers 26 with a leading end portion of the mask member 15G being suspended from the lower pair of rollers 26. The rotation of the rollers 26 is stopped when the green mask member 15G is interposed therebetween.

The blue mask member 15B fed into the mask position adjusting device 31 is brought into intimate contact with the photosensitive recording medium 50 in a manner the same as above, and the medium 50 is exposed to blue light through the blue filter 44B and the blue mask member 15B.

With the above operations, a color latent image is formed on the photosensitive recording medium 50. Then, the exposure stand 52 is elevated to its original position. In this case, the one end (left end in FIG. 2) of the exposure stand 52 is moved away from the stationary roller 56 and the buffer roller 55 is moved in a direction indicated by an arrow E. Accordingly, unexposed zone of the medium 50 subsequent to the thus exposed area is pulled out of the cartridge 51 and is moved to a position below the exposure stand 52. On the other hand, the rotation of the drive roller 57 is stopped when the leading end of the precedent latent image area reaches the pressure roller 71 of the pressure developing unit 70.

In synchronism with the movement of the photosensitive recording medium 50, a color developer sheet 60 is delivered from the cassette 61. The color developer sheet 60 from the cassette 61 is stopped when its leading edge faces the leading end of the latent image on the photosensitive recording medium 50.

The pressure rollers 71 of the pressure developing unit 70 are then rotated in directions indicated by arrows in FIG. 2 and held against each other. In this case, the exposure stand 52 is again moved downwardly, so that the photosensitive recording medium 50 is fixed between the left end of the exposure stand 52 and the stationary roller 56.

The photosensitive recording medium 50 and the color developer sheet 60 which are held in superposed relation to each other are pressed together. At this time, those microcapsules which are not photocured on the photosensitive recording medium 50 are ruptured under pressure, and a colored visible image corresponding to the latent image on the photosensitive recording medium 50 is developed on the color developer sheet 60.

As the pressure rollers 71 rotate in the directions indicated by the arrows in FIG. 2, the buffer roller 55 is moved in the direction indicated by the arrow F. When the leading edge of the developer sheet 60 reaches the separation roller 64, the developer sheet 60 is separated from the photosensitive recording medium 50, and is fed to the thermal fixing unit 80.

In the thermal fixing unit 80, air heated by the heater 81 is circulated within the casing 83 by the blade wheel 82. Therefore, the color developer sheet 60 is heated and the coloring is promoted on the sheet 60. At the same time, binder polymer by which the color developer materials are fixed to the base sheet of the color developer sheet 60 is thermally fused for thereby securing the color developer materials to the base sheet. Further the color developer sheet 60 is calendered to have an even smoothness along its length the same as that of the endless belt 89, so that the color developer sheet 60 has a suitable glossy surface. After the color developing and calendering process, the color developer sheet 60 is separated from the endless belt 89, and is discharged onto the discharge tray 63.

During the pressure developing process and the color developing process and calendering process described above, the photosensitive recording medium 50 is gripped and fastened in a place between the exposure stand 52 and the stationary roller 56. Therefore, another exposure operation can be carried out on the exposure stand 52 with respect to the subsequent area of the photosensitive recording medium while the pressure developing operation is concurrently performed with respect to the precedent area of the photosensitive recording medium 50.

When it is desired to reproduce a plurality of colored images with the same set of mask members 15, the roller pairs 22, 24, 27, 25 and rollers 32 and 33 of the mask position adjusting device 31 are reversely rotated. Further, the gates 28 and 29 have their solid line positions in FIG. 2. Therefore, the blue mask member 15B positioned on the exposure position is fed back to the pair of rollers 24, passed through the gate 28 and is interposed between the pair of rollers 24. When the trailing edge is fed past the gate 28, the rotation of the rollers 24 is stopped for holding the blue mask member 15B therebetween. On the other hand, the red mask member 15R which has been held between the upper pair of the rollers 27 is fed back into the mask position adjusting device 31 by the reversal rotations of the roller pairs 27, 25, 33 and 32, and undergoes position adjustment. Then, the photosensitive recording medium is subjected to red light exposure through the red filter 44R and through the red mask member 15R.

Then, the roller pairs 22, 23, 26 and 25 and the rollers 32, 33 of the mask position adjusting device 31 are reversely rotated. Further, the gates 28 and 29 are shifted to have their broken like positions in FIG. 2. Therefore, the red mask member 15R positioned at the exposure position is further bed back toward the pair of rollers 23, passed through the gate 28 and is interposed between the pair of rollers 23. When the trailing edge of the red mask member 15R is fed past the gate 28, the rotation of the rollers 23 is stopped for holding the red mask member 15R therebetween. On the other hand, the green mask member 15G which has been held between the lower pair of the rollers 26 is fed back into the mask position adjusting device 31 through the gate 29 because of the reversal rotations of the rollers 26, 25, 33 and 32. The green mask member 15G is subjected to position adjustment, and the photosensitive recording medium 50 is exposed to green light through the green filter 44G and through the green mask member 15G.

Then, the green mask member 15G positioned at the exposure position is fed toward the lower pair of rollers 26 by rotating the rollers 32, 33, 25 and 26 in their normal direction. Thereafter, the blue mask member 15B which is held by the pair of rollers 24 is fed to the mask position adjusting device 31 by rotating the rollers 24, 22, 32 and 33 in their normal direction, and exposure operation with blue light is carried out. As a result, a color latent image is formed on the photosensitive recording medium 50 by superposing exposures at three times, and a visible color image is formed on the developer sheet 60 by the operations the same as above. These operations are repeatedly carried out in order to obtain a desired numbers of color copies with the set of the mask members 15R, 15G and 15B.

After the desired number of color images have been reproduced from the same set of mask member 15, the mask members are discharged onto the discharge tray 30 through the upper or lower pairs of the rollers 27 and 26.

If the mask member 15 of a next set happen to be fed from the monochromatic laser printer 1 while a series of colored images are being reproduced in the color image recording apparatus 20, the next set of the mask members are temporarily stored onto the automatic sheet feeder tray 12. If the series of the color reproductions are completed, the stored next set of the mask members are fed into the image recording apparatus 20 one by one by means of the feed rollers 13.

Further, mask members produced by other monochromatic printers or the mask members those previously employed for the image recordation can be manually set onto the automatic sheet feeder tray 12 for the purpose of the color copying operation with using such mask members.

In view of the foregoing, according to the present invention, the mask member is not suspendedly supported but is placed on the mask supporting means such as the glass plate 34 with the mask imaging surface facing the photosensitive recording medium at the exposure position. Therefore, stabilized mask member position is obtainable with a simple and light weight construction. Further, accidental mask member dropping from the endless belt it the conventional suspension type does not occur. Therefore, no mask member jamming occurs at the exposure position.

Further, according to the present invention, each of the mask members can be precisely fed to the exact exposure position by controlling the rotations of the two pairs of rollers 32, 33 in accordance with the position sensors. Further, the lateral position and orientation of the mask members can be controlled by controlling the motors 117 and/or 118 for displacing the links 115 and/or 116 in accordance with the position sensors. Therefore, in the present invention no endless belt is required for attracting the mask member thereto with the static electricity so as to control the mask position, and therefore, the mask position adjusting device can provide a stabilized mask position adjustment operation regardless of the change in ambient condition such as circumambient humidity. Further, since endless belt is not required at the position adjusting device, resultant device can be provided with simple construction at low cost.

While the invention has been described in detail and with reference to specific embodiments thereof, it would be apparent to those skilled in the art that various changes and modifications can be made therein without departing from the spirit and scope of the invention.

What is claimed is:

1. An image recording apparatus for recording a color image with using mask members, each of the mask members being formed with a light shieldable mask image based on an imaging information and each of the mask members being successively fed toward a photosensitive recording medium at an exposure position for superposedly forming latent images thereon upon exposures, the apparatus comprising:

mask member supporting means upon which each one of the mask members is placed, the mask member supporting means being positioned at the exposure position, the mask member supporting means being also positioned below the photosensitive recording medium fed at the exposure position;

mask member feeding means for moving each of the mask members onto the mask member supporting means, the mask feeding means feeding the mask member with the mask image facing upwardly;

a light source positioned below the mask member supporting means; and means for selectively moving the photosensitive recording medium toward and in contact with the mask member on the mask member supporting means.

2. The image recording apparatus as claimed in claim 1, further comprising an exposure stand extending above the mask member supporting means and above the light source, for supporting the photosensitive recording medium thereon at the exposure position.

3. The image recording apparatus as claimed in claim 2, further comprising a main frame; and a positioning frame movable relative to the main frame, and wherein the mask member feeding means comprises a first pair of rollers rotatably supported by the positioning frame and at a position adjacent one side of the exposure position for feeding the mask member in a first direction; and a second pair of rollers rotatably supported by the positioning frame and at a position adjacent another side of the exposure position for feeding the mask member in the first direction, a distance between the first and second pair of rollers being smaller than a length of the mask member in the direction.

4. The image recording apparatus as claimed in claim 3, wherein the mask member supporting means comprises a transparent member supported by the positioning frame and positioned at the exposure position and between the first and second pairs of rollers, each one of the mask members being fed onto the transparent member for exposure operation.

5. The image recording apparatus as claimed in claim 4, wherein each of the mask members is formed with positioning marks, and the image recording apparatus further comprising sensor means for detecting the positioning mark, the sensor means generating an output signal;

laterally moving means for moving the positioning frame in a second direction perpendicular to the first direction; and control means connected to the first and second pairs of rollers and to the laterally moving means for controlling these rollers and the moving means in response to the output signal from the sensor means.

6. The image recording apparatus as claimed in claim 5, further comprising a first motor for drivingly rotating the first and second pair of rollers about their axes, the first motor being connected to the control means.

7. The image recording apparatus as claimed in claim 6, wherein the laterally moving means comprises a second motor, a third motor, a first laterally movable link connected between the second motor and the positioning frame, and a second laterally movable link connected between the third motor and the positioning frame, the second and the third motors being connected to the control means, the first and second laterally movable links being movable in a direction perpendicular to the first direction in accordance with the actuations of the second and the third motors.

8. The image recording apparatus as claimed in claim 7, wherein the positioning frame is formed with a window with which the transparent member is fitted.

9. The image recording apparatus as claimed in claim 5, wherein the positioning frame is formed with a window with which the transparent member is fitted.

10. The image recording apparatus as claimed in claim 9, wherein a mask transfer path is defined at a position upstream of the first pair of rollers, and the apparatus further comprising a curl removing means disposed at the mask transfer path for removing a curl imparted to the mask member before the mask member reaches the exposure position, the curl removing means comprising a small diameter roller, a large diameter roller, and biasing means for urging the large diameter roller toward the small diameter roller, the hardness of the large diameter roller being smaller than that of the small diameter roller.

11. An image recording apparatus for recording a color image on a developer medium with using mask members produced by trichromatic color resolution, each of the mask members being formed with a light shieldable mask image based on an imaging information and with at least one positioning mark, and each of the mask members being successively fed in a first direction and placed on a photosensitive recording medium at an exposure position for forming a latent image thereon upon exposure, the apparatus comprising;

a main frame;

a positioning frame movable relative to the main frame;

sensor means for detecting the positioning mark, the sensor means generating an output signal;

a first pair of rollers rotatably supported by the positioning frame and at a position adjacent one side of the exposure position for feeding the mask member in the first direction;

a second pair of rollers rotatable supported by the positioning frame and at a position adjacent another side of the exposure position for feeding the mask member in the first direction, a distance between the first and second pair of rollers being smaller than a length of the mask member in the direction;

a transparent member supported by the positioning frame and positioned at the exposure position and between the first and second pairs of rollers, each one of the mask members being fed onto the transparent member for exposure operation;

laterally moving means for moving the positioning frame in a second direction perpendicular to the first direction; and control means connected to the first and second pairs of rollers and to the laterally moving means for controlling these rollers and the moving means in response to the output signal from the sensor means.

12. The image recording apparatus as claimed in claim 11, further comprising a first motor for drivingly rotating the first and second pair of rollers about their axes, the first motor being connected to the control means.

13. The image recording apparatus as claimed in claim 12, wherein the laterally moving means comprises a second motor, a third motor, a first laterally movable link connected between the second motor and the positioning frame, and a second laterally movable link connected between the third motor and the positioning frame, the second and the third motors being connected to the control means, the first and second laterally movable links being movable in a direction perpendicular to the first direction in accordance with the actuations of the second and the third motors.

14. The image recording apparatus as claimed in claim 13, wherein the positioning frame is formed with a window with which the transparent member is fitted.

15. An image recording apparatus as claimed in claim 1, wherein said mask member supporting means comprises a transparent member.

16. The image recording apparatus as claimed in claim 1, further comprising a positioning frame and wherein said mask member feeding means comprises first and second pairs of rollers and the mask member supporting means comprises a transparent member supported by the positioning frame and positioned at the exposure position and between the first and second pairs of rollers, each one of the mask members being fed onto the transparent member for exposure operation.

* * * * *